US009215809B2

(12) United States Patent
Nieland et al.

(10) Patent No.: US 9,215,809 B2
(45) Date of Patent: Dec. 15, 2015

(54) CONTACT BUMPS METHODS OF MAKING CONTACT BUMPS

(71) Applicant: SMARTRAC TECHNOLOGY GmbH, Dresden (DE)

(72) Inventors: Carsten Nieland, Gotha (DE); Frank Kriebel, Lichtenberg (DE)

(73) Assignee: SMARTRAC TECHNOLOGY GmbH, Dresden (DE)

( * ) Notice: Subject to any disclaimer, the term of this patent is extended or adjusted under 35 U.S.C. 154(b) by 0 days.

(21) Appl. No.: 14/094,714

(22) Filed: Dec. 2, 2013

(65) Prior Publication Data

US 2014/0084460 A1 Mar. 27, 2014

(51) Int. Cl.
*H01L 23/48* (2006.01)
*H05K 1/18* (2006.01)
*H01L 21/768* (2006.01)
*H01L 23/498* (2006.01)
*H05K 3/30* (2006.01)
*H01L 23/00* (2006.01)

(52) U.S. Cl.
CPC ............ *H05K 1/18* (2013.01); *H01L 21/76885* (2013.01); *H01L 23/49811* (2013.01); *H01L 24/13* (2013.01); *H01L 24/16* (2013.01); *H01L 24/81* (2013.01); *H05K 3/301* (2013.01); *H01L 24/11* (2013.01); *H01L 2224/0401* (2013.01); *H01L 2224/05567* (2013.01); *H01L 2224/11462* (2013.01); *H01L 2224/11622* (2013.01); *H01L 2224/13006* (2013.01); *H01L 2224/13011* (2013.01); *H01L 2224/13012* (2013.01); *H01L 2224/13019* (2013.01); *H01L 2224/13022* (2013.01); *H01L 2224/16113* (2013.01); *H01L 2224/16225* (2013.01); *H01L 2224/73104* (2013.01); *H01L 2224/73204* (2013.01); *H01L 2224/81191* (2013.01); *H01L 2224/81201* (2013.01); *H01L 2224/81206* (2013.01); *H01L 2224/81898* (2013.01); *H01L 2224/83862* (2013.01); *H01L 2224/9211* (2013.01); *H01L 2224/92125* (2013.01); *H01L 2924/00014* (2013.01); *H05K 2201/1059* (2013.01); *H05K 2201/10954* (2013.01)

(58) Field of Classification Search
CPC ......... H01L 24/81; H01L 24/16; H01L 24/13; H01L 2224/81191; H01L 24/11
See application file for complete search history.

(56) References Cited

U.S. PATENT DOCUMENTS

| | | | | |
|---|---|---|---|---|
| 6,537,854 | B1* | 3/2003 | Chang et al. | 438/118 |
| 6,977,213 | B1* | 12/2005 | Tsai et al. | 438/612 |
| 7,390,732 | B1* | 6/2008 | Watanabe et al. | 438/612 |
| 8,102,021 | B2* | 1/2012 | Degani | 257/532 |
| 2004/0214406 | A1* | 10/2004 | Kurita et al. | 438/455 |
| 2006/0163725 | A1* | 7/2006 | Haba et al. | 257/737 |
| 2009/0242258 | A1* | 10/2009 | So et al. | 174/260 |
| 2011/0074024 | A1* | 3/2011 | Pendse | 257/737 |
| 2012/0306104 | A1* | 12/2012 | Choi et al. | 257/782 |

* cited by examiner

*Primary Examiner* — Michele Fan

(57) ABSTRACT

Contact bumps between a contact pad and a substrate can include recesses and protrusions that can mate with the material of the substrate. The irregular mating surfaces between the contact bumps and the contact pads can enhance the bonding strength of the contacts, for example, against shear and tension forces, especially for flexible systems such as smart cards.

22 Claims, 15 Drawing Sheets

CONTACT BUMPS METHODS OF MAKING CONTACT BUMPS

The present application is a continuation-in-part of PCT patent application PCT/DE2013/000451, filed on Aug. 9, 2013, entitled "Contact bumps methods of making contact bumps", which claims priority of German patent application 10 2012 015 811.4, filed on Aug. 10, 2012, entitled "Contact bumps methods of making contact bumps", both of which are hereby incorporated by reference.

BACKGROUND

Contact bumps are playing an essential role in the field of semiconductor technology for contacting semiconductor devices or chips with other substrates or carriers such as printed circuit boards.

Different techniques for forming contact bumps can be used for the connection of the pads of the semiconductor devices, chips, or substrates. An example is the so-called flip-chip technique, in which the bumps are arranged as connection elements on the chip and are optionally contacted with an additional pressure sensitive adhesive to the connecting pads of a carrier substrate. The quality of the connection established between the connection surfaces of the carrier substrate and the bumps plays an essential role in the later use of the components.

In the mechanical method, a gold wire can be used, which is shaped at its tip by the action of heat into a ball. The spherical tip of the gold wire is pressed with a suitable tool to a connection surface of the substrate, so that the ball is deformed by the force applied. Then the wire is pinched off, torn or sheared across the globe, so that a bulbous body with a wire remaining on top as bumps or contact bump remains on the substrate. The remaining on the tip of bulbous body is then flattened generally in the same or another tool. This technique is known as mechanical stud bumping and is known for example from U.S. Pat. No. 5,060,843. The connection of the material of the gold bump with metallization of the pad is performed via the pressure applied and the resulting micro-welding between the two boundary surfaces.

A disadvantage of this technique, however, is that the pads on the substrate are usually not completely covered by the bumps and therefore are not sufficiently resistant to the subsequent use of this substrate to the action of moisture or other influences.

SUMMARY

In some embodiments, the present invention discloses contact bumps and methods of making contact bumps that are configured to form contact with corresponding contact pads. The contact bumps and the corresponding contact pads can be pressed together with a bonding force, which can drive the contact bumps into the material of the contact pads.

The contact bumps can include recesses and protrusions that can mate with the material of the contact pads. The irregular mating surfaces between the contact bumps and the contact pads can enhance the bonding strength of the contacts, for example, against shear and tension forces, especially for flexible systems such as smart cards.

The contact bumps can include two opposite surfaces, with one surface having irregularities such as recesses and/or protrusions, and the other surface making an angle with the bonding force. During the bonding process, materials from the contact pads can be driven to fill the irregularities, for example, due to the side force from the opposite surface.

The contact bumps can be used for chip bonding, such as a semiconductor device bonding with an antenna in an radio frequency identification system, for example, in a smart card, smart label, or ticket.

BRIEF DESCRIPTION OF THE DRAWINGS

FIGS. 10-11A and 11B illustrate a process flow for forming the bonded configuration between a contact bump and a contact pad according to some embodiments.

DETAILED DESCRIPTION OF THE EMBODIMENTS

In some embodiments, the present invention discloses methods and systems for bonding terminal pads of a chip with corresponding contact pads of a substrate, which can be another chip or a system board. The bonding process can including forming a contact bump on a terminal pad, before bonding the contact bump with a corresponding contact pad.

In some embodiments, the contact bump can include an irregular surface, for example, a surface having recesses and protrusions. During the bonding of the contact bump with the contact pad, for example, by applying a contact force on the contact bump to drive the contact bump into the contact pad material, the contact pad material can be driven to form intimate mating with the irregular surface, for example, by filling the recesses or flowing around the protrusion. The intimate contact between the contact pads and the irregular surface of the contact bump can significantly improve the bonding strength of the contact bonding, especially enhancing shear and tension bonding characteristics which can be required in flexible substrates such as smart cards.

FIGS. 1A-1D illustrate various prior art contact bumps, which rely on the bonding strength of the contact bump with the contact pad, together with the increase in contact areas. The contact pads or the contact bump can have pins, which can increase the contact area for improving the bonding strength.

Figure 1A:
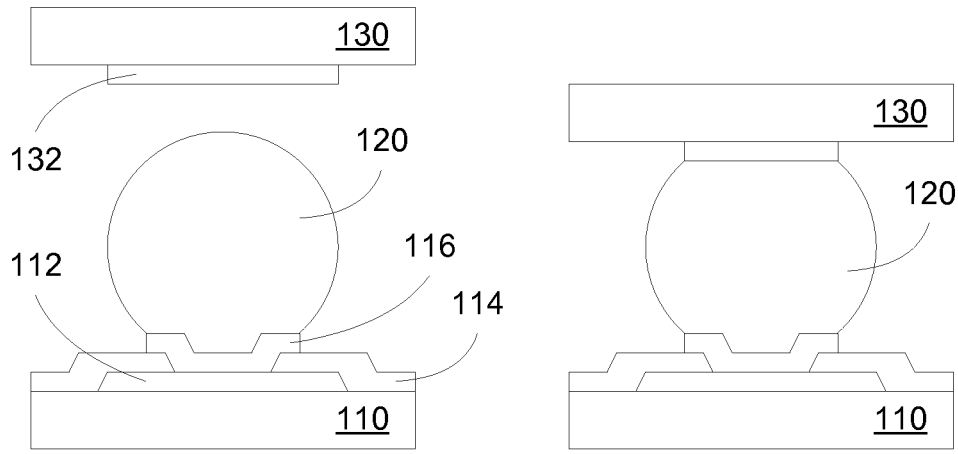
FIGS. 1A-1D illustrate various prior art contact bumps, which rely on the bonding strength of the contact bump with the contact pad, together with the increase in contact areas.

In FIG. 1A, a chip 110 can have a terminal pad 112 disposed on an external surface of the chip. Passivation layer 114 can be included, for example, to isolate the terminal pad 112 from neighbor terminal pads. A layer 116 containing an under bump material (UBM), such as an alloy of aluminum, nickel and copper, can be formed to facilitate the bonding of the contact bump 120 to the terminal pad 112. The contact bump 120 can include solder material or palladium material. A substrate 130 having contact pad 132 can be brought to the contact bump 120 for bonding between the contact bump 120 and the contact pad 132.

Figure 1B:
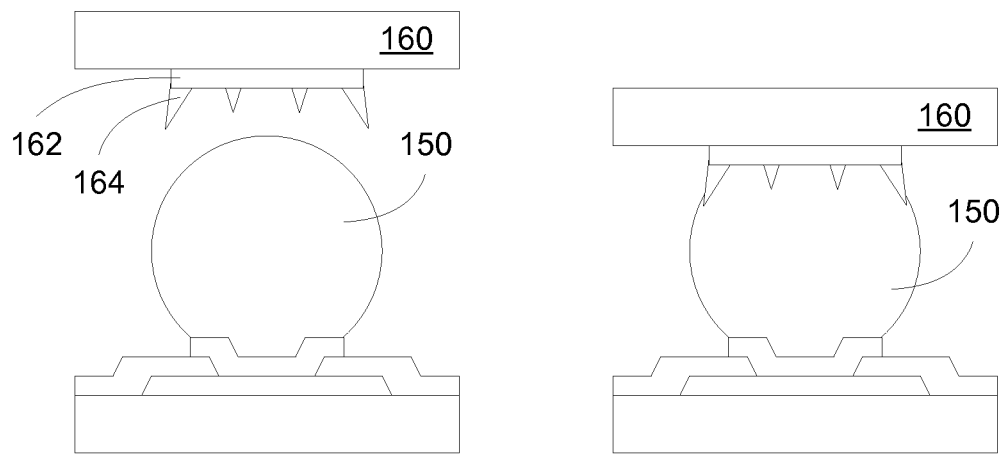
Figures 1C, 1D:
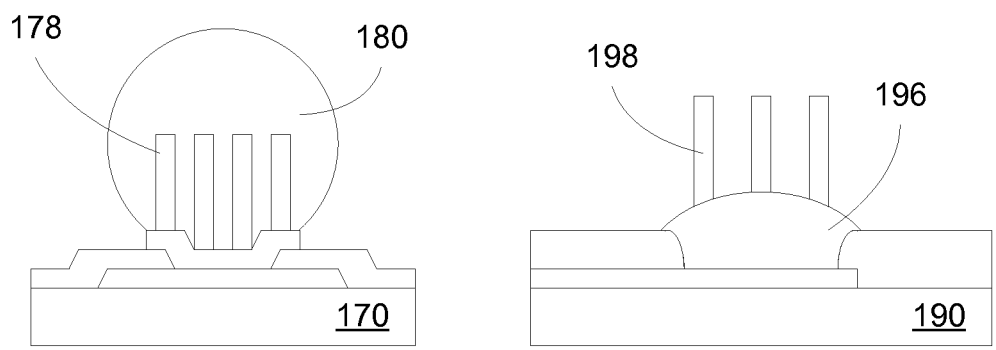

In FIG. 1B, pins 164 can be formed on the contact pad 162 of the substrate 160. The contact between the contact pad 162 and the contact bump 150 can be enhanced by the penetration of pins 164 into the contact bump 150. In FIG. 1C, contact bump 180 can be enforced by pins 178, which can enhance the bonding of the contact bump 180 with the chip 170. In FIG. 1D, pins 198 can protrude from the contact bump 196, which can enhance the bonding of the contact bump 196, bonding the chip 190 with a contact pad of the substrate.

In some embodiments, the present invention discloses contact bonding processes, and the contact bumps fabricated for the contact bonding processes, that can further include a physical attachment between the contact bump and the contact pad, in addition to the surface chemical bonding. The physical attachment can include multiple protrusions between the contact bump and the contact pad, thus can provide separation resistance. For example, the contact bump can have an irregular surface that includes recesses and protrusions. The irregular surface of the contact bump can be mated to a corresponding surface of the contact pad. The recesses and protrusions at the interface of the bonded surfaces can provide an additional resistance to any separation force in the shear direction.

Figure 2A:
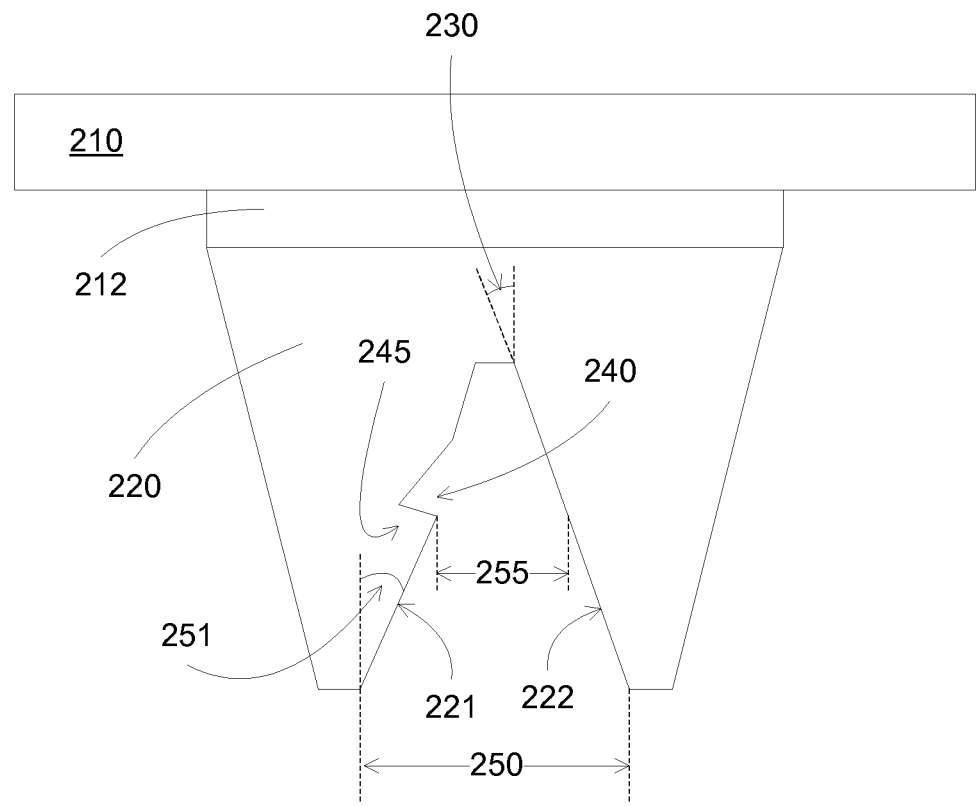
FIGS. 2A-2B illustrate a contact bump and a corresponding contact bonding process according to some embodiments.
Figure 2B:
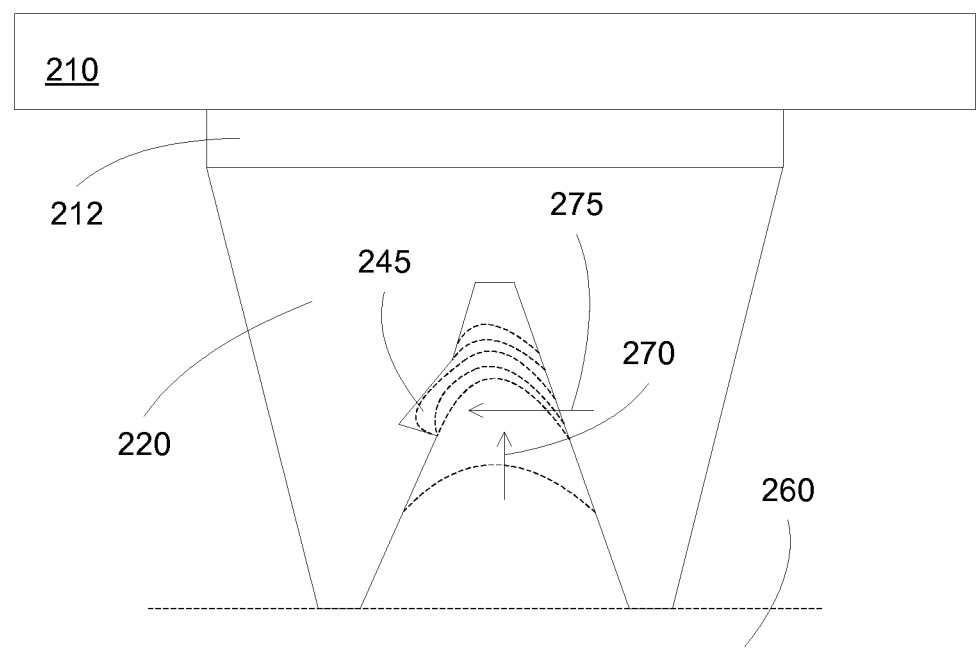

FIGS. 2A-2B illustrate a contact bump and a corresponding contact bonding process according to some embodiments. A contact bump 220 can be fabricated on a terminal pad 212 of a substrate 210, such as a semiconductor chip. The contact bump 220 is shown to be directly formed on the terminal pad 212, but other configurations can also be used, such as a passivation layer for isolating the contact bump 220 with neighbor contact bumps, or an UBM layer for improving adhesion and contact resistance between the contact bump 220 and the terminal pad 212.

The contact bump 220 can have two facing surfaces 221 and 222, e.g., inner surfaces of the contact bump. A surface, such as surface 221, can have irregularities, e.g., a non-smooth surface with recess 240 and/or protrusion 245, which can provide physical bonding to a bonded contact pad against tensile separation. The irregularities can include recesses and protrusions having dimensions of a few percents of the contact bump dimension, such as greater than about 1 micron, greater than 3 or 5 microns, or greater than about 10 microns.

The two surfaces can be tapered upward, e.g., forming a taper angle 251 with the direction perpendicular to the terminal pad 212, with the lower opening 250 can be larger than the upper opening 255. The taper of the surfaces can force the material from the contact pad to rise upward, which can be driven sideway to fill the recess 240 to flow around the protrusion 245. The taper angle can be greater than zero degree, such as greater than about 10 degrees, or can be greater than about 30 degrees.

The facing surface, e.g., surface 222, can form an angle 230 with the direction of the bonding force. Typically, the contact bump can be pressed against a contact pad 260 in a direction perpendicular to the terminal pad 212. Thus the surface 222 can form an angle 230 with the normal direction of the terminal pas 212. When a force is applied to the contact bump for bonding with the contact pad, materials from the contact pad can rise 270 to make contact with the surface 222. Since the surface 222 forms an angle with the applied force, the normal force at the surface 222 can have a side component 275, which can direct the material sideway to fill in the recess 245 or to flow around the protrusion. The angle can be greater than zero degree, such as greater than about 10 degrees, or can be greater than about 30 degrees.

Figure 3A:
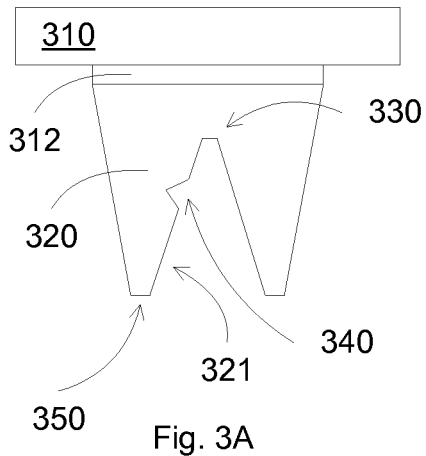
FIGS. 3A-3F illustrate different configurations for the contact bump according to some embodiments.
Figure 3D:
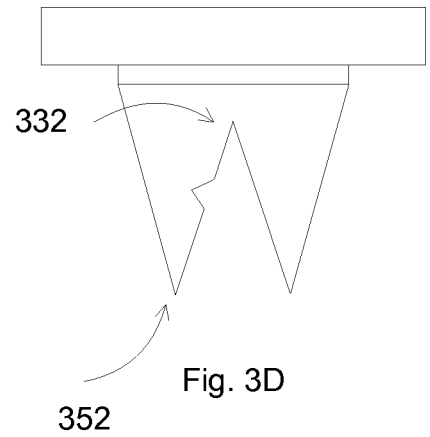
Figure 3B:
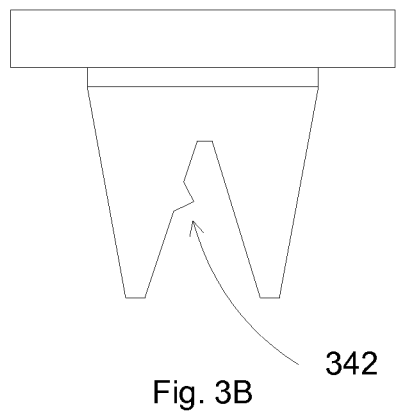
Figure 3E:
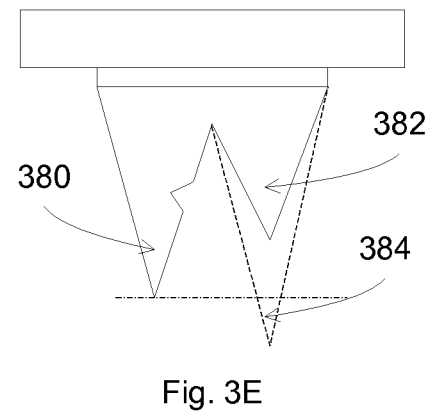
Figure 3C:
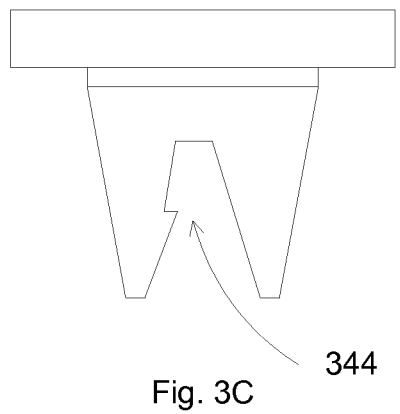

FIGS. 3A-3F illustrate different configurations for the contact bump according to some embodiments. A contact bump 320 can be bonded to a terminal pad 312 on a substrate 310. In FIG. 3A, a contact bump can have a recess 340 on an inner surface 321, which forms angle of about 15 degrees with the normal direction of terminal pad 312. The tips 350 of the contact bump can be flat. The top portion 330 of the inner surface 321 can also be flat when facing with the opposite surface. In FIG. 3B, the contact bump can have a protrusion 342 on an inner surface. In FIG. 3C, the contact bump can have a combination of protrusion and recess 344 on an inner surface. Other irregular surfaces can be used, for example, multiple recesses and protrusions on an inner surface of the contact bump. Also, the recesses and protrusions of the irregular surface can be random, generated from a deposition process when forming the contact bump.

Figure 3F:
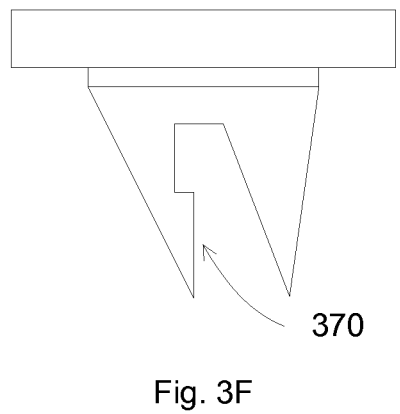

In FIG. 3D, the tips 352 of the contact bump can be sharp, which can facilitate the penetration of the contact bump to the contact pad. The top portion 332 of the inner surface can also be sharp. In FIG. 3E, the tips of the contact bump can have different height. For example, one tip 382 can be shorter than the other tip 380. The tip 384 can be longer than the other tip 380. In FIG. 3F, the surface 370 having the irregularities can be in the normal direction of the terminal pad 312. The opposite facing surface can form an angle with the normal direction, which can provide a horizontal or side force to drive the excess material to fill in the gaps in the irregular surface 370.

The connection area can be covered the entire surface on the substrate through the layer deposition. The generation of the bump can be in several stages. Adhesion and barrier layer can be deposited by sputtering or evaporation on the connecting metallization and then possibly reinforced by electroplating. For example, Cr, stainless steel, Cu, Ti, Pt, Au, TiW, TiW, Ni, or any alloys or combinations can be used. The contact material can include Au, Cu, Ni, SnPb, AuSn, SnAg, In, or any alloys or combinations, which can be applied by vapor deposition or electrodeposition. For solder bump, SnPb, SnAg and In can be used. For welding, Au and In can be used. Bumps of Au, Ni and Cu may be used by an additional application of adhesive or solder bumps on the substrate or on the side of a solder or adhesive bond.

Alternatively, Al or Cu alloy can be used with silicon wafers, which can be deposited without the use of masks, e.g., by an electroless plating, using Ni or Pd on the contact metallization. With Cu and Au, this can normally be strengthened.

In some embodiments, the present invention can provide methods for the production of contact bumps and bumps which allow the production of an electrical connection of the bump with bond pads, or other connection elements to form a more effective and a higher connection reliability.

Figure 4A:
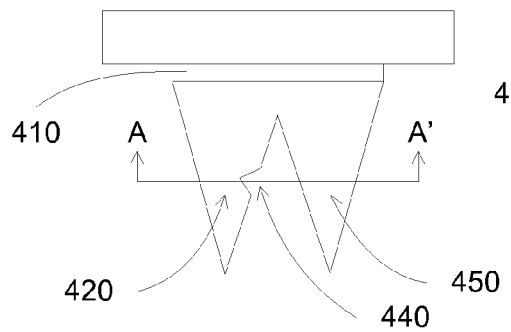
FIGS. 4A-4F illustrate various configurations for the cross section of the contact bump according to some embodiments.

FIGS. 4A-4E illustrate various configurations for the cross section of the contact bump according to some embodiments. In FIG. 4A, a cross section view of the contact bump can show two contact tips 420 and 450 bonded to a terminal pad 410. Recess 440 can be provided at the contact tip 420. One recess 440 is shown, but the contact bump can have other irregularities, such as multiple recesses or protrusions, in a surface of one contact tip 420 or 450 or in surfaces of both contact tips 420 and 450. Cut line AA' can show different cross section views of the contact bump.

Figure 4B:
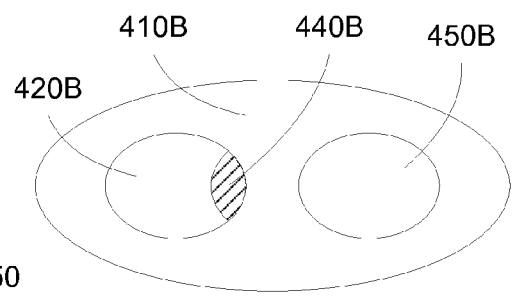
Figure 4C:
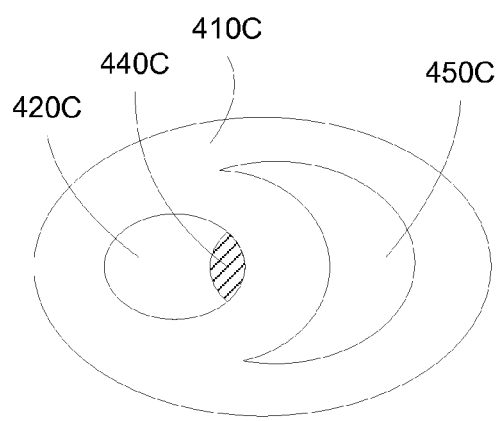
Figure 4D:
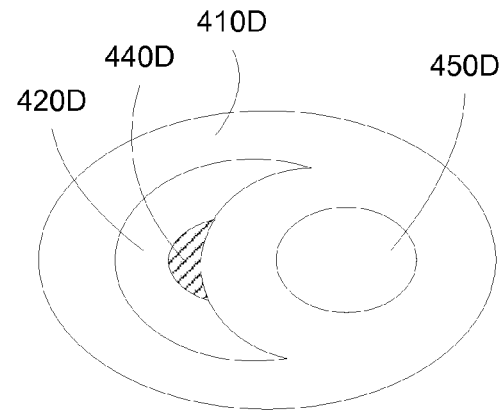
Figure 4E:
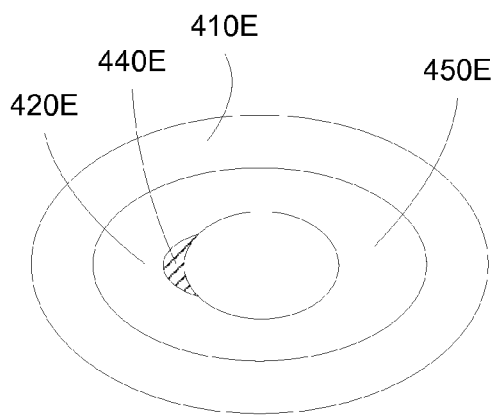
Figure 4F:
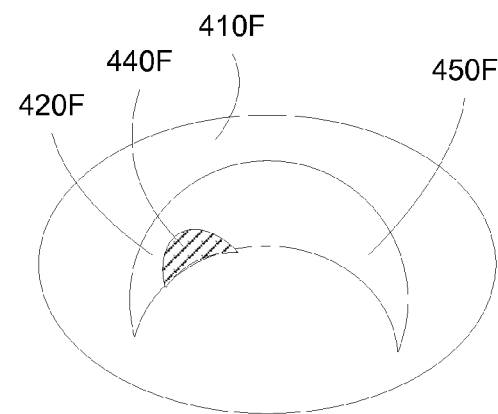

FIG. 4B shows that the contact bump can include two pyramid-like cones 420B and 450B protruded from the terminal pad 410B. Recess 440B can be shown on a surface of cone 420B. FIG. 4C shows that the contact bump can include a pyramid-like cone 420C, together with a half moon cone 450C protruded from the terminal pad 410C. Recess 440C can be shown on a surface of cone 420C. The recess 440C can be surrounded by a half moon surface of cone 450C, which can provide horizontal force to the recess at multiple direction, allowing the material from the contact pad to easily fill in the recess. FIG. 4D shows that the contact bump can include a half moon cone 420D, together a pyramid-like cone 450D protruded from the terminal pad 410D. Recess 440D can be shown on a surface of cone 420D. FIG. 4E shows that the contact bump can include a circular cone 420E/450E protruded from the terminal pad 410E. The circular cone can have the shape of a inverted volcano having a hollow portion in the middle. Recess 440E can be shown on a surface of the circular cone. FIG. 4F shows that the contact bump can have a shape of a partially surrounding wall, such as a half moon shape, protruded from the terminal pad 410F, with facing surfaces or facing extended portions 420F and 450F. Recess 440F can be shown on a surface of the extended portion 420F.

Figure 5A:
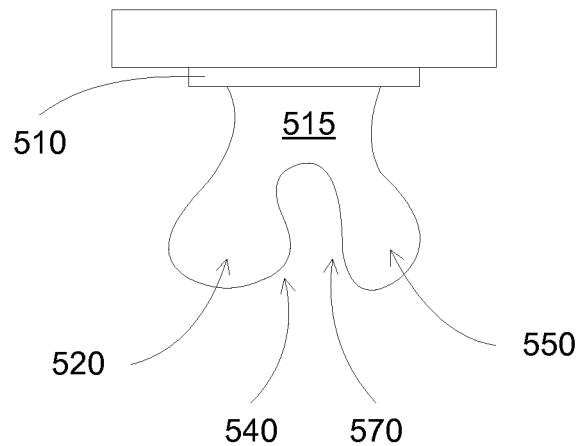
FIGS. 5A-5C illustrate other configurations for the contact bump according to some embodiments.
Figure 5B:
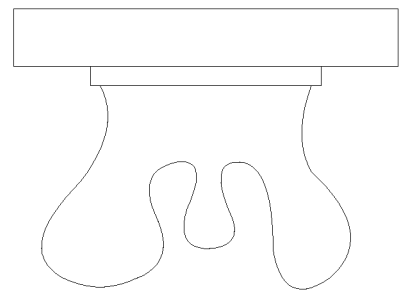
Figure 5C:
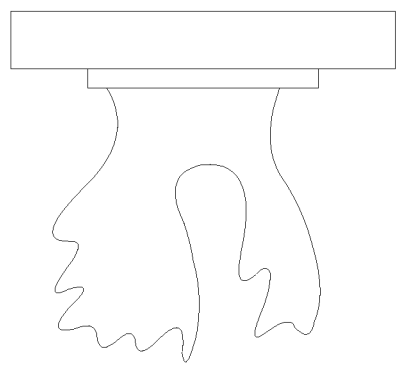

FIGS. 5A-5C illustrate other configurations for the contact bump according to some embodiments. In FIG. 5A, a cross section of a contact bump 515 is shown, which is disposed on a terminal pad 510. The contact bump 515 shows two tips 520 and 550, having a mushroom shape. The mushroom shape can include a recess or a protrusion at the end of the tip, or a larger tip portion than a body portion. The mushroom shape 520 can include a protrusion 540. The mushroom shape 550 can include an angle surface 570. In FIG. 5B, the contact bump can include three mushroom tips. In FIG. 5C, the contact bump can include mushroom tips having irregular patterns. Other shapes can be formed, such as more than three tips, different mushroom shapes, or a combination of mushroom shapes and cone shapes.

Figure 6A:
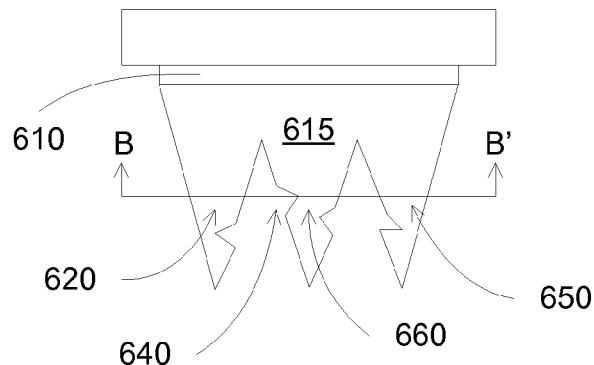
FIGS. 6A-6F illustrate other configurations for the contact bump according to some embodiments.
Figure 6B:
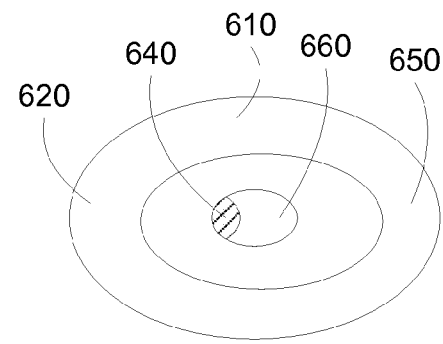

FIGS. 6A-6F illustrate other configurations for the contact bump according to some embodiments. In FIG. 6A, a cross section of a contact bump 615 is shown, which is disposed on a terminal pad 610. The cross section view of the contact bump 615 shows three tips 620, 650 and 660. Multiple recesses and protrusions 640 can be formed on the inner surfaces of the tips. FIG. 6B shows the cross section view of cut line BB', with the tips 620 and 650 having a volcano shape and the tip 660 a cone shape in the middle of the volcano.

Figure 6C:
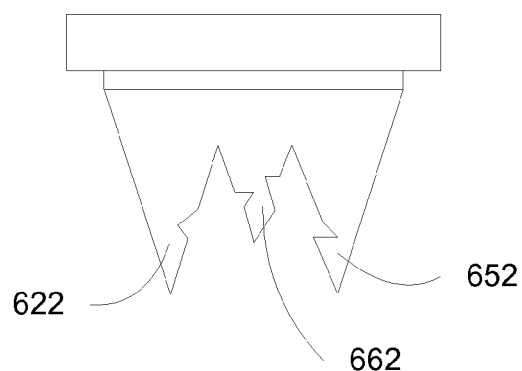
Figure 6D:
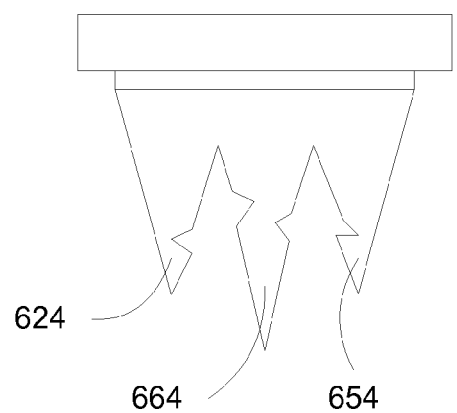
Figure 6E:
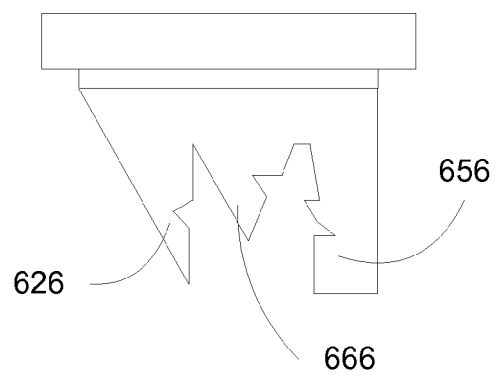
Figure 6F:
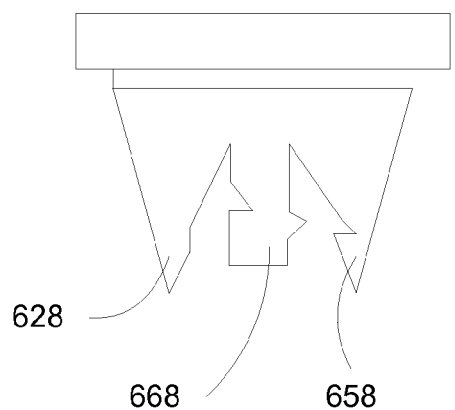

FIGS. 6C-6F show other configurations of the contact bump. In FIG. 6C, the middle tip 662 can be shorter than the surrounding tips 622 and 652. In FIG. 6D, the middle tip 664 can be longer than the surrounding tips 624 and 654. In FIG. 6E, the surrounding tips 626 and 656 can have vertical surfaces, e.g., planes parallel to the normal direction of the terminal pad or perpendicular to the plane of the terminal pad. The middle tip 666 can have slant surface for assist in filling the recesses and protrusions. In FIG. 6F, the middle tip 668 can have vertical surfaces. The surrounding tips 628 and 658 can have slant surface for assist in filling the recesses and protrusions.

Figure 7A:
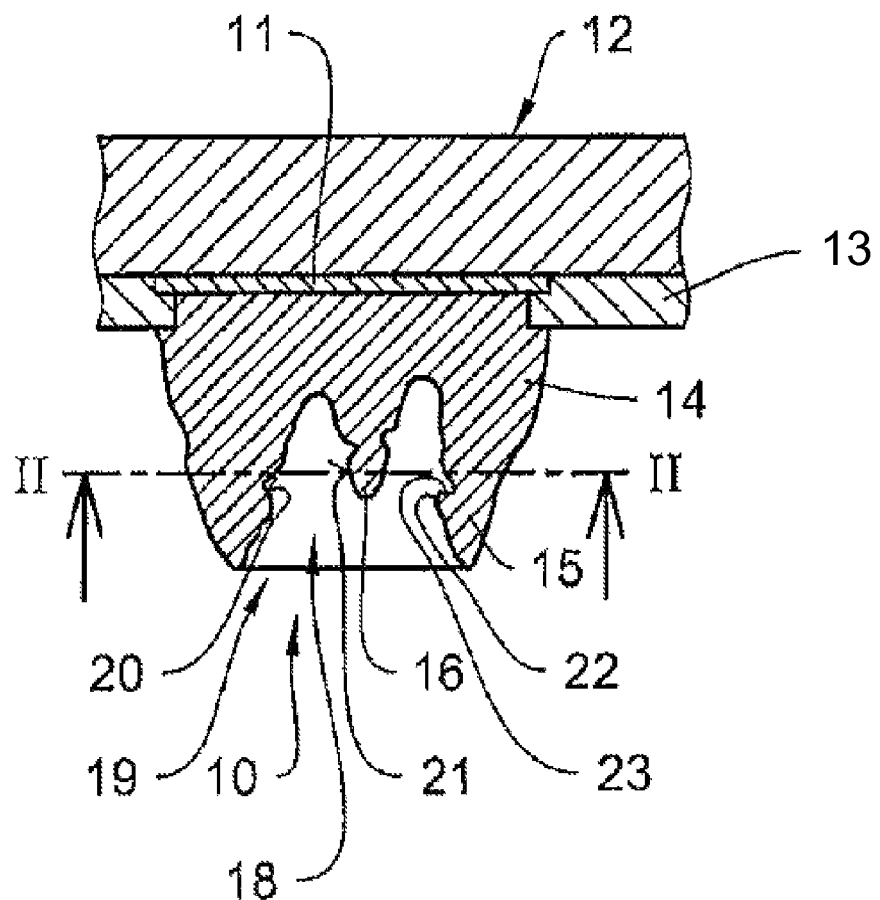
FIGS. 7A-7B illustrate a contact bump configuration according to some embodiments.
Figure 7B:
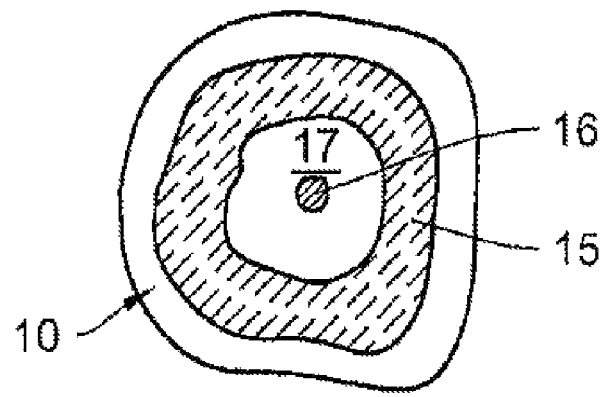

FIGS. 7A-7B illustrate a contact bump configuration according to some embodiments. FIG. 7A shows a cross section view of the contact configuration 10. FIG. 7B shows a cut view II-II. A contact bump configuration 10 can include a contact bump 14 formed on a terminal pad 11 of a semiconductor chip 12. Passivation layer 13 can be used to isolate the neighbor contact bumps. The contact bump 14 can have the shape of surrounding walls 15 and a middle cone 16 raised from the floor 17. The surrounding walls 15 can form a hollow chamber 18 with opening 19. The inner surfaces of the surrounding walls 15 can have multiple recesses and protrusions 20, 21, 22, and 23.

In some embodiments, the present invention discloses a contact bump with improve contact bonding with a contact pad. The improved contact bonding can include physical attachments between the surfaces of the contact bump and the surfaces of the contact pad. The physical attachments can include irregular interfaces with recesses and protrusions, which can enhance the separation resistance of the contact bump from the contact pad, especially for tensile and shear stresses.

In some embodiments, the contact bumps can include a non-smooth surface, e.g., a surface having irregularities, and another facing surface. The two surfaces can be tapered toward the terminal pad, e.g., the contact bump has a larger opening at the end of the bump (e.g., away from the terminal pad) as compared to a smaller opening nearer the terminal pad. The facing surface can form an angle with the normal direction of the terminal pad.

In some embodiments, the contact bump can include a wall surrounding a cone. The wall can have sharp ends for ease of penetration to the contact pad. The inner surfaces of the wall or the surfaces of the cone can be non-smooth, e.g., having irregularities such as recesses and protrusions.

In some embodiments, the contact bump can be formed by a deposition process, such as an electroless plating process. The contact bump can also be formed by a photolithography process, together with other processes such as deposition and etching. The contact bump can include palladium or palladium alloy materials.

Figure 8A:
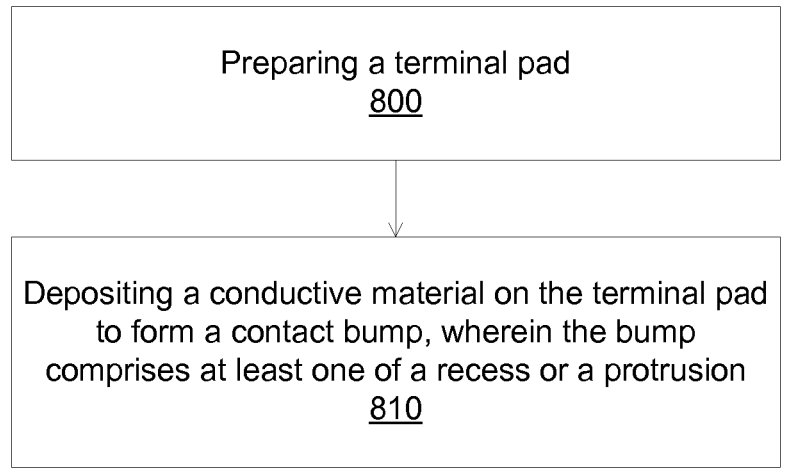
FIGS. 8A-8B illustrate flow charts for forming contact bumps according to some embodiments.
Figure 8B:
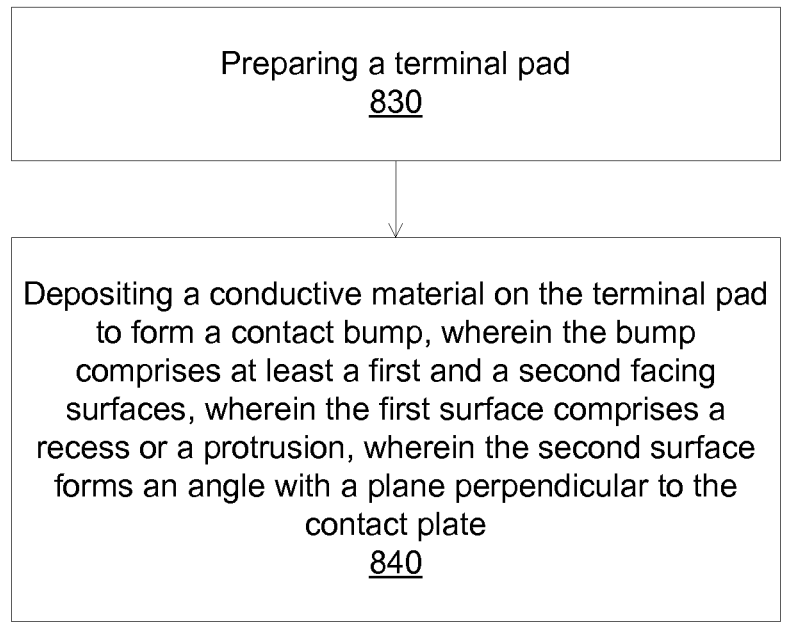

FIGS. 8A-8B illustrate flow charts for forming contact bumps according to some embodiments. In FIG. 8A, operation 800 prepares a terminal pad. The terminal pad can be formed on a substrate or on a semiconductor chip. Operation 810 deposits a conductive material on the terminal pad to form a contact bump. The contact bump can have an irregular surface with recesses and/or protrusions. The recesses and protrusions can be disposed on an inner surface of the contact bump, meaning a surface of the contact bump facing another surface of the contact bump. The conductive material can include palladium, such as palladium element or a palladium alloy.

In FIG. 8B, operation 830 prepares a terminal pad. The terminal pad can be formed on a substrate or on a semiconductor chip. Operation 840 deposits a conductive material on the terminal pad to form a contact bump. The contact bump can have a two facing surfaces, with at least a surface having irregularities of recesses and/or protrusion, and a surface forming an angle with the normal direction of the terminal pad. The conductive material can include palladium, such as palladium element or a palladium alloy.

Figure 9:
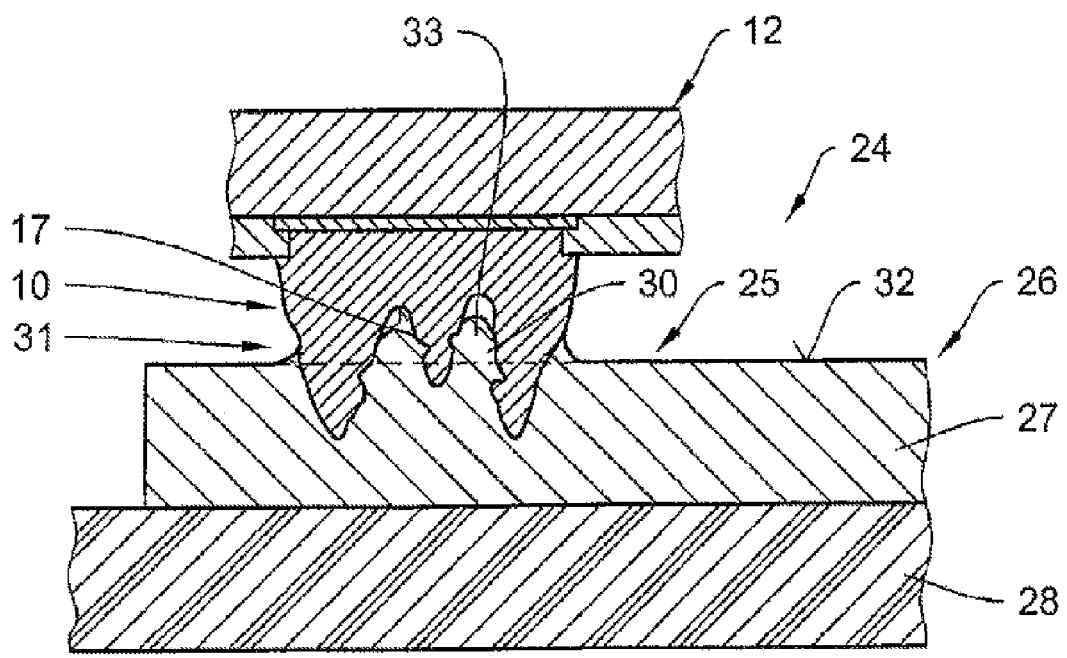
FIG. 9 illustrates a bonded configuration of a contact bump with a contact pad according to some embodiments.

FIG. 9 illustrates a bonded configuration of a contact bump with a contact pad according to some embodiments. A bonded configuration 24 can include a top substrate 12 having a contact bump 10, and a bottom substrate 26 having a contact pad 27 on layer 28. The contact bump 10 can penetrate the contact pad 27 from the contact surface 32, with mating surfaces 30 between the contact bump 10 and the contact pad 27. The mating surfaces contain irregularities, such as recesses and protrusions, which can enhance the bonding between the contact bump and the contact pad. The irregularities can form physical attachments which can be effective against tensile force. For example, raised portions 31 and 33 from the contact pad 27 can enhance the contact surface between the bump 10 and the contact pad 27.

Figure 10:
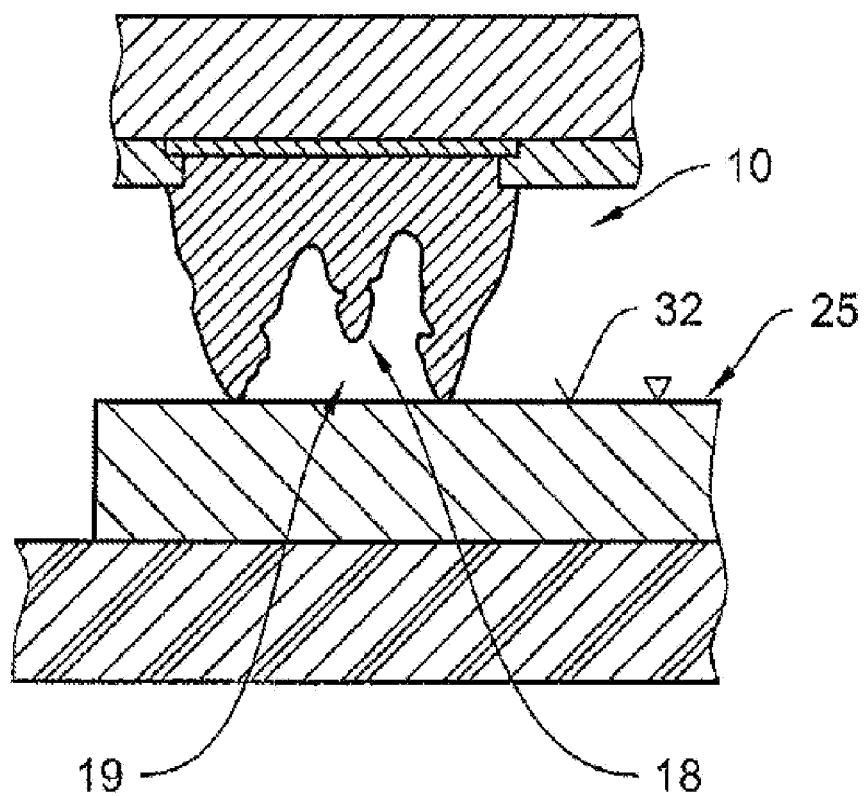

FIGS. 10-11A and 11B illustrate a process flow for forming the bonded configuration between a contact bump and a contact pad according to some embodiments. In FIG. 10, a contact bump 10 is brought into contact with a contact pad 25. The tips of the contact bump are shown to touch the surface 32 of the contact pad 25. The contact bump can form a chamber 19, surrounded by the walls of the contact bump. A middle cone 18 of the contact bump is disposed in the chamber 19.

Figure 11A:
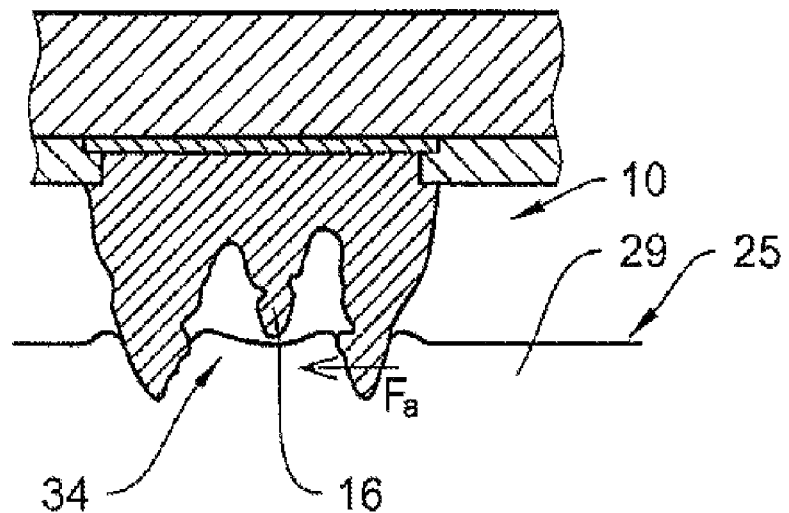
Figure 11B:
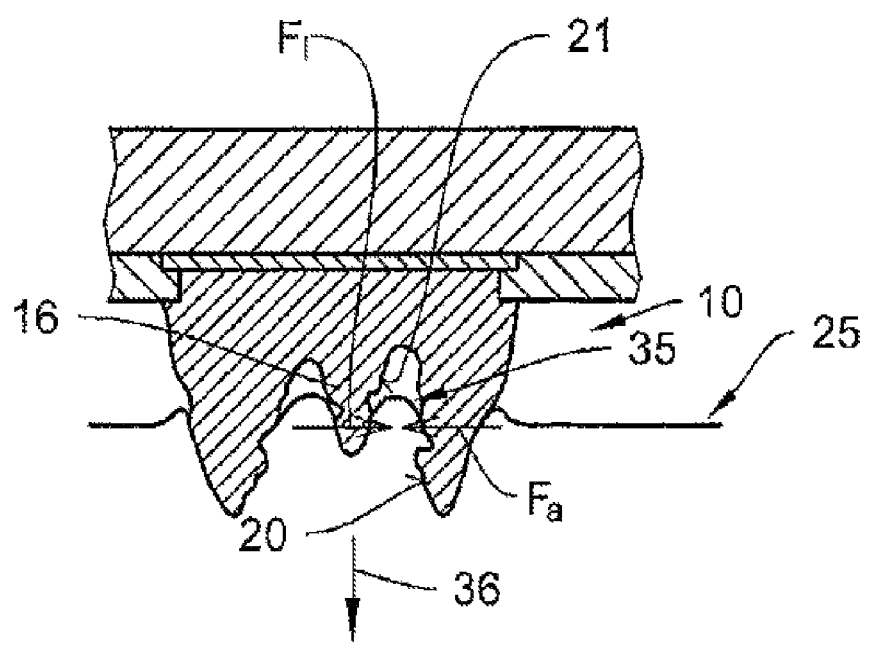

In FIG. 11A, a force is applied to the contact bump to drive the contact bump into the contact pad. The walls of the contact bump can penetrate the contact pad surface, and can drive the material 34 of the contact pad 27 inward (as shown by force Fa). As shown, the material 29 is outside the bump 10 and thus is not subjected to the force Fa. In FIG. 11B, the contact bump is further driven into the contact pad. The surrounding walls and the middle cone of the contact bump can penetrate the material of the contact pad, and can push the material inward for filling the recesses and irregularities of the inner surfaces of the contact bump. For example, forces Fa and Fi can push on the material of the contact pad to fill the hollow area 35 in the contact bump. Heating and agitation process can be added to assist in the flow of material to the surface irregularities. A vibration process, such as an ultrasonic vibration, can be used during the pressing of the contact bump into the contact pad. The vibration can be in a direction transverse to the pressing direction 36. Alternatively or additionally, the vibration can be in the direction of the pressing direction 36.

Figure 12A:
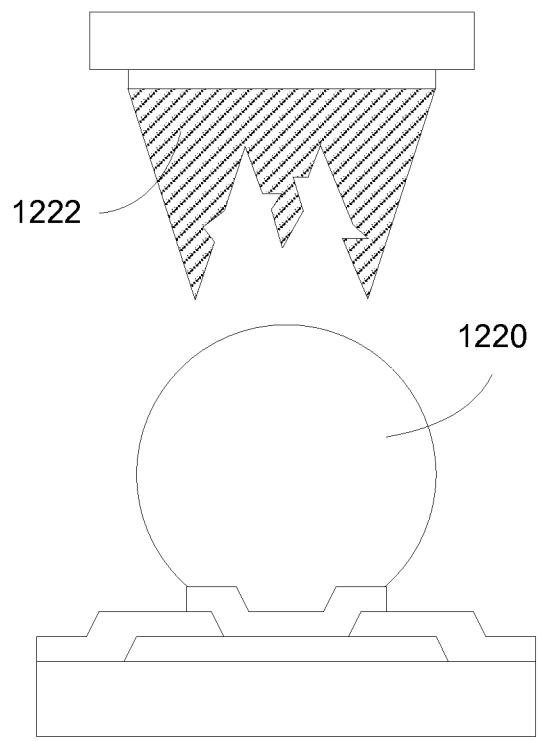
FIGS. 12A-12B illustrate another process flow for forming the bonded configuration between a top contact bump and a bottom contact bump according to some embodiments.
Figure 12B:
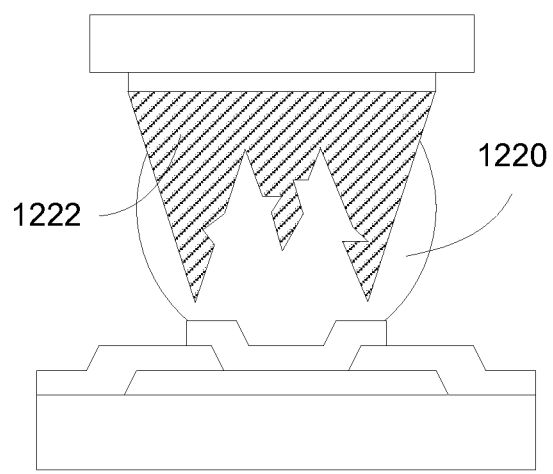

FIGS. 12A-12B illustrate another process flow for forming the bonded configuration between a top contact bump and a bottom contact bump according to some embodiments. A top contact bump 1222 having surface irregularities can be brought into contact with a bottom contact bump 1220. The top contact bump can penetrate the bottom contact bump, with the surface irregularities providing additional bonding strength for the bonded configuration.

Figure 13A:
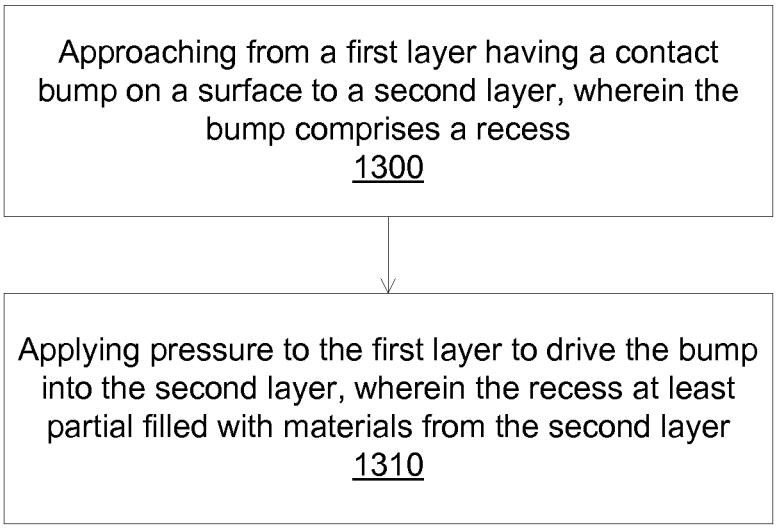
FIGS. 13A-13B illustrate flow charts for forming contact with contact bumps according to some embodiments.
Figure 13B:
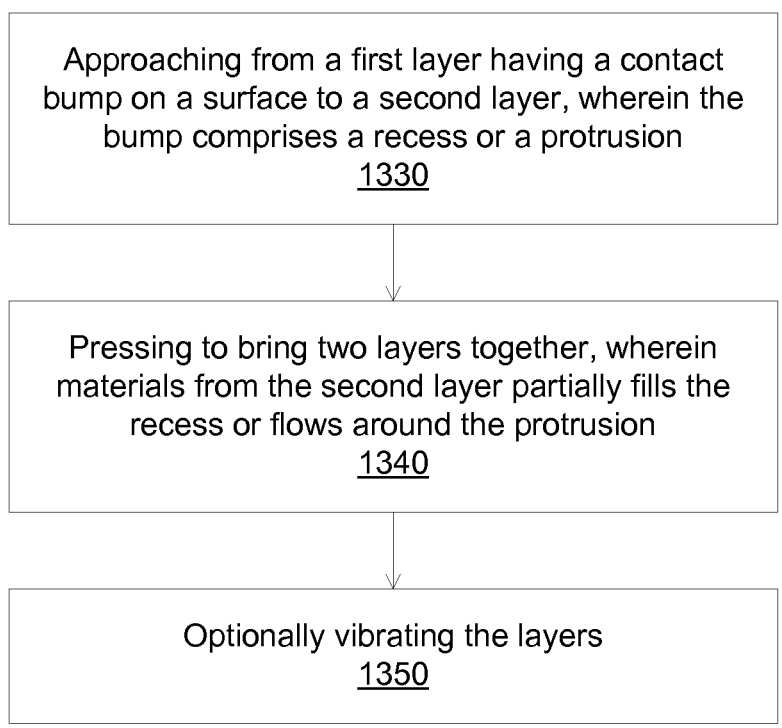

FIGS. 13A-13B illustrate flow charts for forming contact with contact bumps according to some embodiments. In FIG. 13A, operation 1300 approaches, by a first layer having a contact bump, to a second layer. The contact bump can have an irregular surface with recesses and/or protrusions. The recesses and protrusions can be disposed on an inner surface of the contact bump, meaning a surface of the contact bump facing another surface of the contact bump. The conductive material can include palladium, such as palladium element or a palladium alloy. The contact bump and/or the contact pad surfaces can be optionally coated with an adhesion layer. Operation 1310 applies pressure to the first layer to drive the contact bump into the second layer. The surface irregularities of the contact bump can be filled with the material from the second layer, which can strengthen the bond between the first and second layers.

In FIG. 13B, operation 1330 approaches, by a first layer having a contact bump, to a second layer. The contact bump can have an irregular surface with recesses and/or protrusions. The recesses and protrusions can be disposed on an inner surface of the contact bump, meaning a surface of the contact bump facing another surface of the contact bump. The conductive material can include palladium, such as palladium element or a palladium alloy. The contact bump and/or the contact pad surfaces can be optionally coated with an adhesion layer. Operation 1340 brings two layers together, wherein the configuration of the contact bump allows the material of the second layer to fill the surface irregularities. Operation 1350 optionally vibrates the layers, in a direction transverse and/or along the direction of the force bringing the two layers together. Thermal energy can also be provided.

In some embodiments, the bonded configurations with the contact bumps can be used for radio frequency identification (RFID) devices. The contact bump can be fabricated on the RFID chip, and the contact pads can be fabricated on an antenna. The RFID chip can be bonded to the antenna, forming a complete RFID chip.

In some embodiments, the RFID device can be used on a card, e.g., a flexible surface. The enhanced bonding of the contact bonding between the RFID chip and the antenna can significantly improve the reliability of the RFID card, for example, against bending during everyday usage.

Figure 14A:
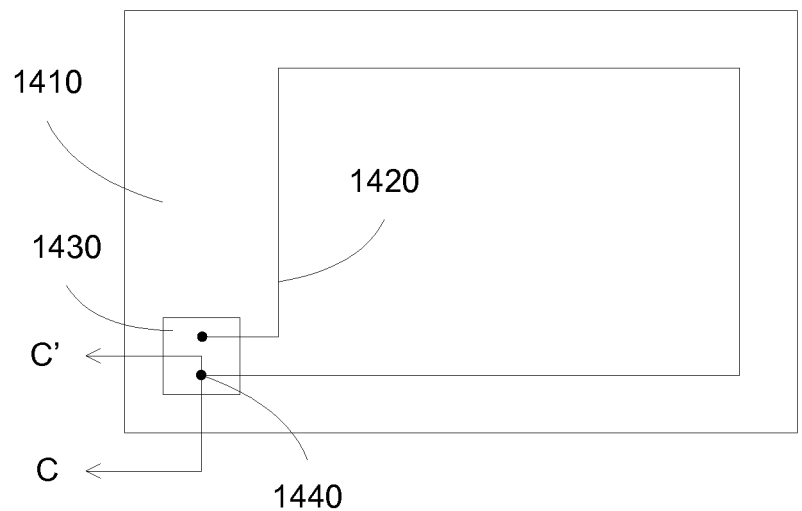
FIGS. 14A-14B illustrate a RFID card having a contact bump bonding according to some embodiments.
Figure 14B:
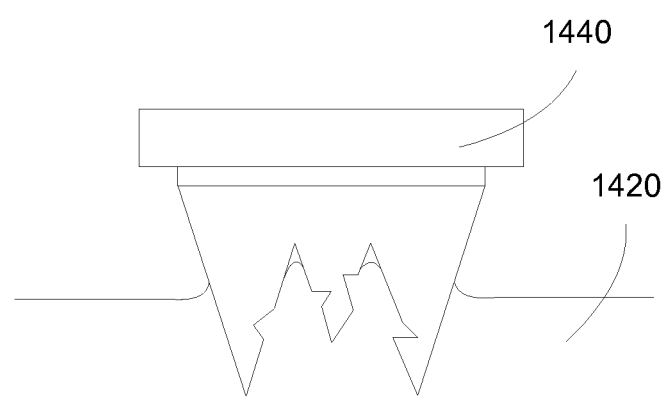

FIGS. 14A-14B illustrate a RFID card having a contact bump bonding according to some embodiments. A card 1410 can have an antenna 1420 fabricated thereon. A chip 1430 having contact bumps 1440 can be bonded to the contact pads of the antenna. The contact bumps can have surface irregularities, which can form intimate contact with the contact pads for better bonding strength.

Figure 15:
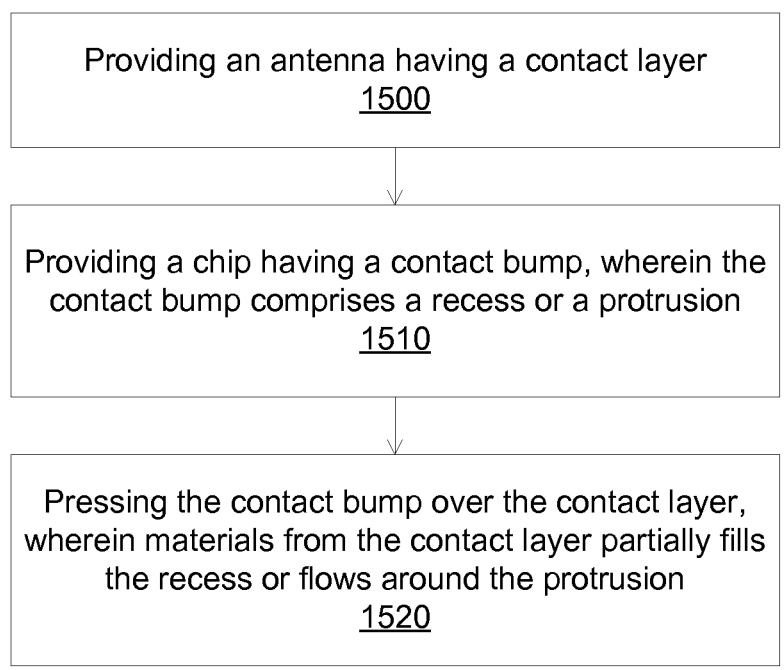
FIG. 15 illustrates a flow chart for forming antenna contact with contact bumps according to some embodiments.

FIG. 15 illustrates a flow chart for forming antenna contact with contact bumps according to some embodiments. Operation 1500 provides an antenna having contact pads. The antenna can be fabricated on a card, such as a smart card. Operation 1510 provides a chip, such as an RFID chip, having contact bumps. The contact bump can have an irregular surface with recesses and/or protrusions. The recesses and protrusions can be disposed on an inner surface of the contact bump, meaning a surface of the contact bump facing another surface of the contact bump. The conductive material can include palladium, such as palladium element or a palladium alloy. The contact bump and/or the contact pad surfaces can be optionally coated with an adhesion layer. Operation 1520 applies pressure to the first layer to drive the contact bump into the second layer. The surface irregularities of the contact bump can be filled with the material from the second layer, which can strengthen the bond between the chip and the antenna. The contact bonding process can also include vibrating the components, in a direction transverse and/or along the direction of the pressing force. Thermal energy can also be provided.

In some embodiments, an adhesion layer can be provided on the contact bump before contacting the contact bump with the substrate.

In some embodiments, the present invention discloses a bump connection between a contact pad and a substrate. The bump connection can include a conductive bump, which can electrically connect the contact pad and the substrate. The contact pad can be connected to a terminal of an electronic component, such as a radio frequency identification (RFIF) chip. The substrate can include a contact pad of another electronic component, or a terminal of an antenna, which can be configured for coupling to the RFID chip.

The bump connection can include a contact pad, which has a lateral surface, which can be configure for bonding to a terminal of an electronic component, such as a device or an antenna. The bump connection can include a contact bump. The contact bump can be coupled to the lateral surface. The contact bump can include a first surface and a second surface. The first surface can face the second surface. The first surface can include a recess or a protrusion. The second surface can form an angle with a direction perpendicular to the lateral surface.

In some embodiments, the first surface can surround the second surface. The second surface can surround the first surface. The contact bump can include at least a first and a second extended portions, The first extended portion can include the first surface, The second extended portion can include the second surface. The second extended portion can form a hollow chamber which can surround the first portion. The first extended portion can surround the second extended portion. The second extended portion can surround the first extended portion. The first extended portion can be disposed next to the second portion. The second surface can include a recess or a protrusion. The first surface can form an angle with the perpendicular direction. The second surface can be operable to exert a force in a direction parallel to the lateral surface when the contact bump can be pushed against an object surface in a direction perpendicular to the lateral surface. The contact pad can be connected to a terminal of an electronic component. The bump connector can be configured to form a hollow chamber and a middle portion disposed in the hollow chamber. The hollow chamber and the middle portion can include the first and second surfaces. The first extended portion can be disposed in the hollow chamber. The material in the substrate can be configured to be mated with the recess or protrusion. The material in the substrate can be configured to be interlocked with the recess or protrusion. The second extended portion can surround the first extended portion. The first extended portion can be shorter than the second extended portion. The substrate can include a terminal end of an antenna. The first extended portion can include a sharp tip. The second extended portion can include a sharp tip. The first and second extended portions can form a mushroom shape. The bump connection can be formed in an rfid device between a chip and an antenna.

In some embodiments, the present invention discloses a bump connection. The bump connection can include a contact pad, a substrate, and a bump connector electrically connecting the contact pad and the substrate. The contact pad can include a lateral surface. The bump connector can be coupled to the lateral surface of the contact pad. The bump connector can include a first extended portion and a second extended portion. The first and second extended portions are at least partially embedded in the substrate. The second extended portion at least partially can surround the first extended portion. The first or the second extended portion can include a recess or a protrusion. The first and second extended portions are at least partially embedded in the substrate passing the recess or the protrusion. The first or the second extended portion facing the recess or the protrusion can form an angle with a direction perpendicular to the lateral surface, which can be operable to push the material of the substrate to mate with the recess or protrusion.

In some embodiments, the contact pad can be connected to a terminal of an electronic component. The bump connector can be configured to form a hollow chamber. The first extended portion can be disposed in the hollow chamber. The second extended portion can form a hollow chamber which can surround the first portion. The material in the substrate can be displaced to be mated with the recess or protrusion. The material in the substrate can be displaced to be interlocked with the recess or protrusion. The second extended portion completely can surround the first extended portion. The first extended portion can be shorter than the second extended portion. The substrate can include a terminal end of an antenna. The first extended portion can include a sharp tip. The second extended portion can include a sharp tip. The first and second extended portions form a mushroom shape. The bump connection can be formed in an rfid between a chip and an antenna.

In some embodiments, the present invention discloses a method for forming a bump interconnect between a first contact pad and a substrate. The method can include pressing a bump connector on the substrate. The bump connector can be coupled to a lateral surface of the first contact pad. The bump connector can include a first extended portion having a first surface and a second extended portion having a second surface. The first surface can face the second surface. The first surface can include a recess or a protrusion. The second surface can form an angle with a direction perpendicular to the lateral surface. The pressing can be operable to displace the material in the substrate to interlock with the recess or protrusion of the bump connector. The method can include vibrating the bump connector during the pressing.

The material of the substrate can flow in a lateral direction to fill the recess or a space above the protrusion. The vibration can be in a direction parallel to the lateral surface.

In some embodiments, the method can include forming an electronic component. The electronic component can include the first contact pad. The first contact pad can include the bump connector. The method can include forming a second component. The second component can include a contact surface. The bump connector can be pressed on the contact surface of the second component. The method can include forming an rfid chip. The rfid chip can include the first contact pad. The method can include forming the bump connector coupled to the lateral surface of the first contact pad. The method can include forming an antenna. The bump connector can be pressed on a surface of the antenna.

What is claimed is:
1. A bump connection, comprising:
a contact pad,
   wherein the contact pad comprises a lateral surface;
a contact bump,
   wherein the contact bump is coupled to the lateral surface,
   wherein the contact bump comprises a hollow space between a first surface and a second surface of the contact bump,
   wherein the first surface faces the second surface across the hollow space,
   wherein at least one of the first surface or second surface comprises a side surface,
   wherein the side surface has a recess or a protrusion, and
   wherein the second surface forms an angle with a direction perpendicular to the lateral surface.
2. A bump connection as in claim 1,
wherein the first surface surrounds the second surface, or
wherein the second surface surrounds the first surface, or
wherein the first surface is disposed next to the second surface.
3. A bump connection as in claim 1, further comprising:
a substrate comprising a conductive material,
   wherein the material in the substrate is configured to be mated or inter locked with the recess or protrusion.
4. A bump connection as in claim 1,
wherein the contact bump comprises at least a first and a second extended portions,
wherein the first extended portion comprises the first surface, and
wherein the second extended portion comprises the second surface.
5. A bump connection as in claim 4,
wherein the first extended portion surrounds the second extended portion, or
wherein the second extended portion surrounds the first extended portion, or wherein the first extended portion is disposed next to the second extended portion.

6. A bump connection as in claim 4,
wherein the first extended portion comprises a sharp tip, or wherein the second extended portion comprises a sharp tip.

7. A bump connection as in claim 1,
wherein the contact bump is configured to be mated or interlocked with a terminal end of an antenna.

8. A bump connection as in claim 1,
wherein the bump connection is formed in an RFID device between a chip and an antenna.

9. A bump connection, comprising:
a contact pad,
  wherein the contact pad comprises a lateral surface;
a contact bump,
  wherein the contact bump is coupled to the lateral surface,
  wherein the contact bump comprises a first surface and a second surface,
  wherein the first surface faces the second surface,
  wherein at least one of the first surface or second surface comprises a side surface,
  wherein the side surface has a recess or a protrusion, and
  wherein the second surface forms an angle with a direction perpendicular to the lateral surface,
  wherein the bump connector is configured to form a hollow chamber and a middle portion disposed in the hollow chamber, and
  wherein the hollow chamber and the middle portion comprises the first and second surfaces.

10. A bump connection as in claim 9,
wherein the middle portion has a larger tip portion than a body portion.

11. A bump connection as in claim 9,
wherein the recess or protrusion is at a side surface of the hollow chamber or a tip of the middle portion.

12. A bump connection, comprising:
a contact pad,
  wherein the contact pad comprises a lateral surface;
a substrate;
a bump connector electrically connecting the contact pad and the substrate,
  wherein the bump connector is coupled to the lateral surface of the contact pad,
  wherein the bump connector comprises a first extended portion and a second extended portion,
  wherein at least one of the first and second extended portions comprises a tip and a side surface,
  wherein the first and second extended portions are at least partially embedded in the substrate,
  wherein the second extended portion at least partially surrounds the first extended portion,
  wherein the side surface has a recess or a protrusion,
  wherein the first and second extended portions are at least partially embedded in the substrate passing the recess or the protrusion, and
  wherein the other one of the at least one of the first or the second extended portions facing the recess or the protrusion forms an angle with a direction perpendicular to the lateral surface, which is operable to push the material of the substrate to mate with the recess or protrusion.

13. A bump connection as in claim 12,
wherein the bump connection is formed in an RFID device between a chip and an antenna.

14. A bump connection, comprising:
a contact pad,
  wherein the contact pad comprises a lateral surface;
a substrate;
a bump connector electrically connecting the contact pad and the substrate,
  wherein the bump connector is coupled to the lateral surface of the contact pad,
  wherein the bump connector comprises a first extended portion and a second extended portion,
  wherein at least one of the first and second extended portions comprises a side surface,
  wherein the first and second extended portions are at least partially embedded in the substrate,
  wherein the second extended portion at least partially surrounds the first extended portion,
  wherein the side surface has a recess or a protrusion,
  wherein the first and second extended portions are at least partially embedded in the substrate passing the recess or the protrusion, and
  wherein the other one of the at least one of the first or the second extended portions facing the recess or the protrusion forms an angle with a direction perpendicular to the lateral surface, which is operable to push the material of the substrate to mate with the recess or protrusion,
  wherein the second extended portion forms a hollow chamber which surrounds the first extended portion.

15. A bump connection as in claim 14,
wherein the first or second extended portion has a larger tip portion than a body portion.

16. A bump connection as in claim 14,
wherein the recess or protrusion is at a tip of the first or second extended portion.

17. A method for forming a bump interconnect between a first contact pad and a substrate, the method comprising:
pressing a bump connector on the substrate,
  wherein the bump connector is coupled to a lateral surface of the first contact pad,
  wherein the bump connector comprises a first extended portion having a first tip and a first side surface, and a second extended portion having a second tip and a second side surface,
  wherein the first side surface faces the second side surface,
  wherein the first side surface has a recess or a protrusion,
  wherein the second side surface forms an angle with a direction perpendicular to the lateral surface, and
  wherein the pressing is operable to displace the material in the substrate to interlock with the recess or protrusion of the bump connector.

18. A method as in claim 17,
wherein the material of the substrate flows in a lateral direction to fill the recess or a space above the protrusion.

19. A method as in claim 17, further comprising:
vibrating the bump connector.

20. A method as in claim 19,
wherein the vibration is in a direction parallel or perpendicular to the lateral surface.

21. A method as in claim 17, further comprising:
forming an electronic component,
wherein the electronic component comprises the first contact pad,
wherein the first contact pad comprises the bump connector;

forming a second component,
wherein the second component comprises a contact surface, and
wherein the bump connector is pressed on the contact surface of the second component.

22. A method as in claim 17, further comprising:
forming an RFID chip, wherein the RFID chip comprises the first contact pad;
forming the bump connector coupled to the lateral surface of the first contact pad; and
forming an antenna, wherein the bump connector is pressed on a surface of the antenna.

\* \* \* \* \*